United States Patent
Hirota

(10) Patent No.: US 8,179,738 B2
(45) Date of Patent: May 15, 2012

(54) INTERNAL POWER SUPPLY CONTROL CIRCUIT OF SEMICONDUCTOR MEMORY

(75) Inventor: Akihiro Hirota, Tokyo (JP)

(73) Assignee: Oki Semiconductor Co., Ltd., Tokyo (JP)

(*) Notice: Subject to any disclaimer, the term of this patent is extended or adjusted under 35 U.S.C. 154(b) by 257 days.

(21) Appl. No.: 12/728,317

(22) Filed: Mar. 22, 2010

(65) Prior Publication Data

US 2010/0246307 A1 Sep. 30, 2010

(30) Foreign Application Priority Data

Mar. 26, 2009 (JP) .................................. 2009-076405

(51) Int. Cl.
*G11C 5/14* (2006.01)

(52) U.S. Cl. .......... 365/226; 365/227; 365/229; 365/194

(58) Field of Classification Search ................. 365/226, 365/227, 229, 194
See application file for complete search history.

(56) References Cited

U.S. PATENT DOCUMENTS

| 6,678,206 B2* | 1/2004 | Chu et al. ................. 365/189.08 |
| 7,376,039 B2* | 5/2008 | Choi et al. .................... 365/228 |
| 7,420,857 B2* | 9/2008 | Hirota et al. ............. 365/189.09 |

FOREIGN PATENT DOCUMENTS

| JP | 2001093275 A | 4/2001 |
| JP | 2008004249 A | 1/2008 |

* cited by examiner

*Primary Examiner* — Son Dinh
(74) *Attorney, Agent, or Firm* — Volentine & Whitt, PLLC

(57) ABSTRACT

An internal power supply control circuit of a semiconductor memory includes a periodic signal generating unit that generates a periodic signal to generate a permission signal to intermittently permit supply of power from an internal power supply circuit of the semiconductor memory to an internal circuit thereof with a predetermined period, when a mode changes from a normal operation mode where power is always supplied from the internal power supply circuit to the internal circuit to a standby mode where consumption power is further suppressed as compared with consumption power in the normal operation mode, and a permission signal output unit that outputs the permission signal synchronized with the periodic signal to the internal power supply circuit, when a mode signal indicating any mode of the normal operation mode and the standby mode and the periodic signal are input and the input mode signal indicates the standby mode.

2 Claims, 14 Drawing Sheets

INTERNAL POWER SUPPLY CONTROL CIRCUIT OF SEMICONDUCTOR MEMORY

CROSS-REFERENCE TO RELATED APPLICATION

This application is based on and claims priority under 35 USC 119 from Japanese Patent Application No. 2009-076405 filed on Mar. 26, 2009, the disclosure of which is incorporated by reference herein.

BACKGROUND

1. Technical Field

The invention relates to an internal power supply control circuit of a semiconductor memory.

2. Related Art

In the related art, various technologies for suppressing a consumption of electric current in a standby mode to suppress consumption of power in a semiconductor memory, such as a ROM, have been suggested (for example, Japanese Patent Application Laid-Open (JP-A) Nos. 2001-93275 and 2008-4249).

In order to satisfy the standby current standard in the standby mode, an internal power supply circuit that supplies power to an internal circuit in the semiconductor memory may not be operating at all times. For this reason, in the standby mode, the supply of power by the internal power supply circuit is stopped. After the mode changes from the standby mode to a normal operation mode, the supply of power by the internal power supply circuit starts.

However, if the supply of power by the internal power supply circuit starts after the mode changes from the standby mode to the normal operation mode, the access standard for the semiconductor memory may not be satisfied. Meanwhile, in order to realize a high-speed access, the internal power supply circuit needs to be operating at all times. However, as described above, if the internal power supply circuit is continuously operated even in the standby mode, the standby current standard may not be satisfied.

SUMMARY

Accordingly, it is an object of the present invention to provide an internal power supply control circuit of a semiconductor memory that may suppress consumption of electric current in a standby mode and suppress an access speed from being lowered, when the standby mode changes to a normal operation mode.

An internal power supply control circuit of a semiconductor memory according to an aspect of the invention provides an internal power supply control circuit of a semiconductor memory, including: a periodic signal generating unit that generates a periodic signal to generate an intermittent permission signal to intermittently permit supply of power from an internal power supply circuit of the semiconductor memory to an internal circuit thereof with a predetermined period, when a mode changes from a normal operation mode where power is always supplied from the internal power supply circuit to the internal circuit to a standby mode where consumption power is less than that in the normal operation mode; and an intermittent permission signal output unit that outputs the intermittent permission signal synchronized with the periodic signal to the internal power supply circuit, when a mode signal indicating any mode of the normal operation mode and the standby mode and the periodic signal are input and the input mode signal indicates the standby mode.

BRIEF DESCRIPTION OF THE DRAWINGS

Exemplary embodiments of the present invention will be described in detail based on the following figures, wherein.

DETAILED DESCRIPTION

Hereinafter, an exemplary embodiment of the present invention will be described in detail with reference to the accompanying drawings.

Figure 1:
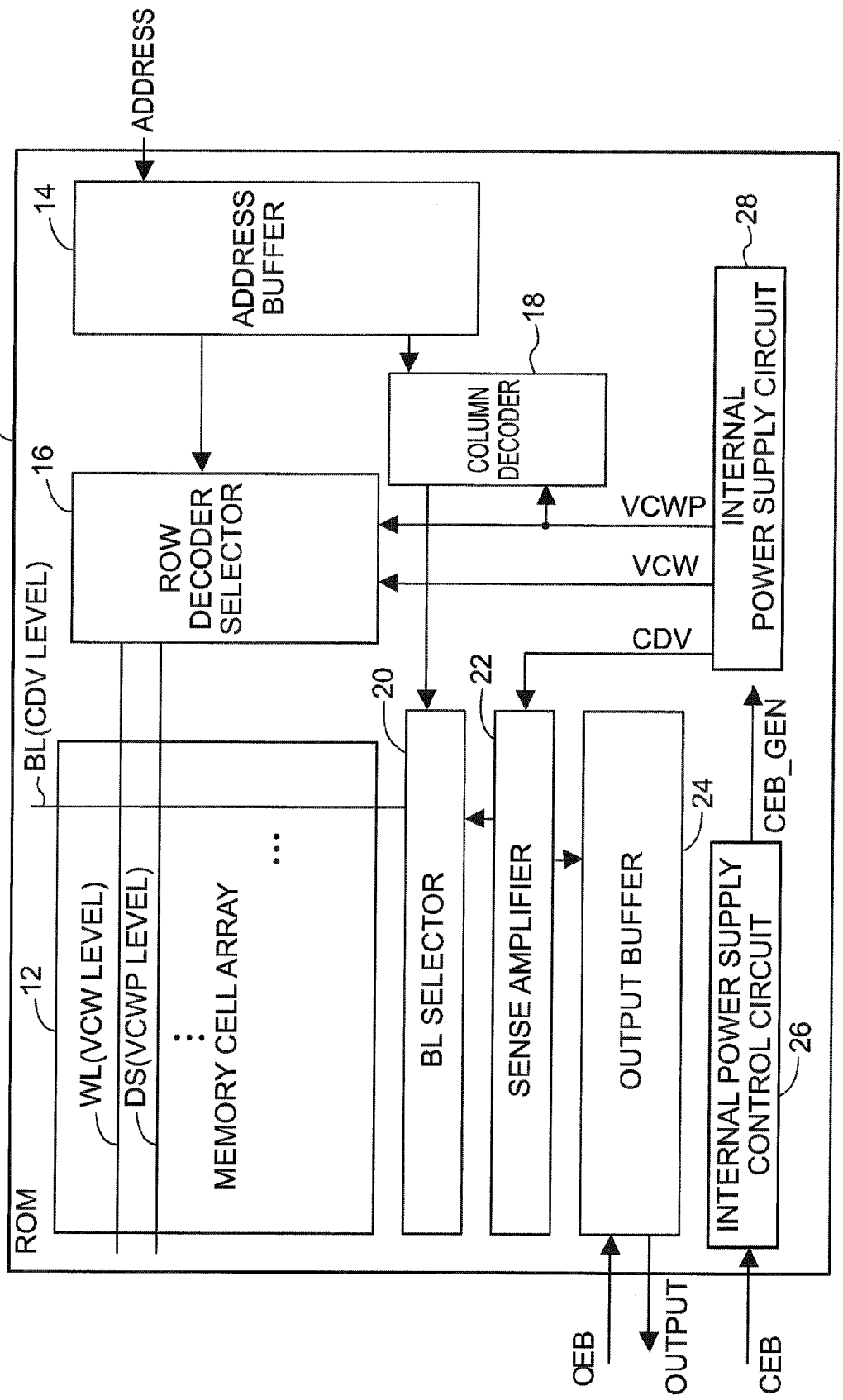
FIG. 1 is a diagram illustrating the schematic configuration of a ROM.

FIG. 1 illustrates the schematic configuration of a ROM 10 that functions as a semiconductor memory according to the invention. As illustrated in FIG. 1, the ROM 10 includes a memory cell array 12, an address buffer 14, a row decoder selector 16, a column decoder 18, a BL selector 20, a sense amplifier 22, an output buffer 24, an internal power supply control circuit 26, and an internal power supply circuit 28.

The memory cell array 12 is composed of plural sub-arrays, and each sub-array includes plural memory cells.

The address buffer 14 stores an address that is designated by a control circuit (not illustrated) that controls the ROM 10.

The row decoder selector 16 selects a sub-array selection line DS and a word line WL according to a row address included in the address stored in the address buffer 14, and applies a voltage VCW supplied from the internal power supply circuit 28 to the selected word line WL. The row decoder selector 16 applies a voltage VCWP supplied from the internal power supply circuit 28 to the sub-array selection line DS.

The column decoder 18 outputs a column address, which is included in the address stored in the address buffer 14, to a bit line (BL) selector 20.

The BL selector 20 selects a bit line BL according to the column address that is output from the column decoder 18 and applies a voltage CDV, which is supplied from the internal power supply circuit 28 through the sense amplifier 22, to the selected bit line BL.

The sense amplifier 22 detects a current flowing through a memory cell, which is selected by the word line WL selected by the row decoder selector 16 and the bit line BL selected by the BL selector 20, among memory cells constituting the memory cell array 12, and outputs data corresponding to a determination result of '0' or '1' to the output buffer 24.

The output buffer 24 stores the input data of the memory cell and outputs the stored data, when a level of an output enable signal OEB input from a control circuit (not illustrated) to control the ROM 10 becomes low.

When a level of a chip enable signal CEB input from the control circuit to control the ROM 10 becomes low, the internal power supply control circuit 26 causes a level of the internal power supply circuit enable signal CEB_GEN to become low, to permit the supply of power from the internal power supply circuit 28 to the internal circuits such as the row decoder selector 16, the column decoder 18, and the sense amplifier 22. As a result, the voltage CDV is supplied from the internal power supply circuit 28 to the sense amplifier 22, the voltage VCW is supplied to the row decoder selector 16, and the voltage VCWP is supplied to the row decoder selector 16 and the column decoder 18.

When the chip enable signal CEB is at a low level, the ROM 10 enters in a normal operation mode. When the chip enable signal CEB is at a high level, the ROM 10 enters in a standby mode.

Figure 2:
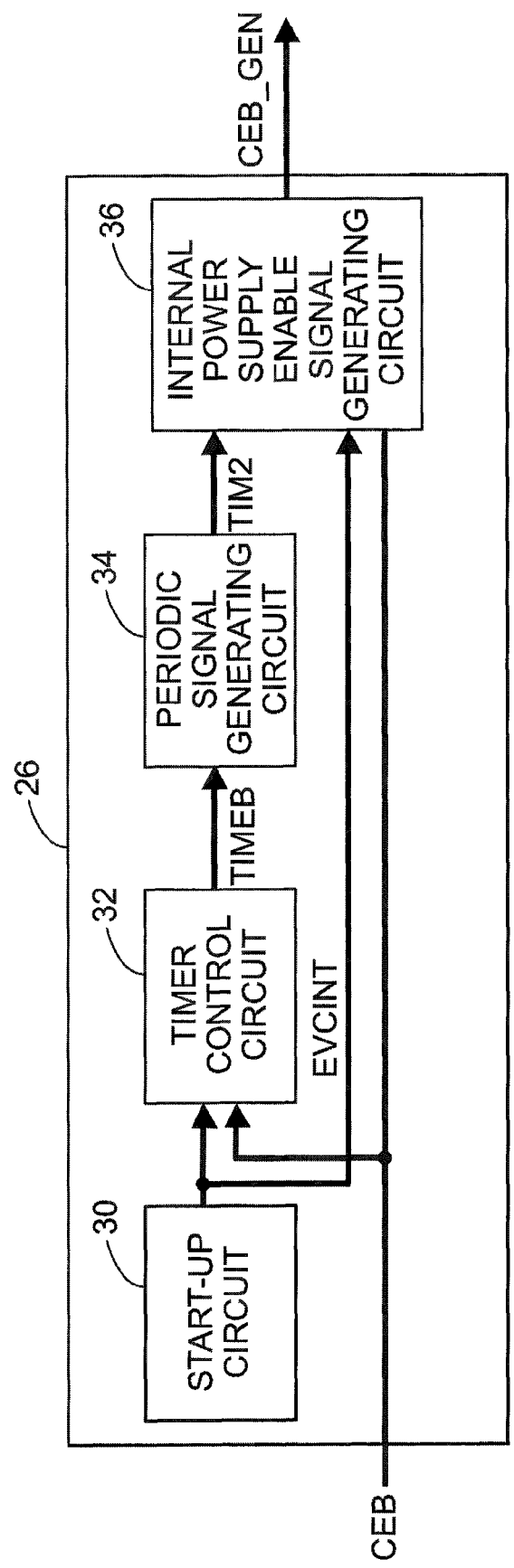
FIG. 2 is a diagram illustrating the schematic configuration of an internal power supply control circuit.

As illustrated in FIG. 2, the internal power supply control circuit 26 includes a start-up circuit 30, a timer control circuit 32, a periodic signal generating circuit 34, and an internal power supply enable signal generating circuit 36.

The start-up circuit 30 outputs a signal EVCINT (illustrated in the first graph of FIG. 3), of which a level is maintained at a low level during a constant period and then becomes a high level, when power is supplied, to the timer control circuit 32. During the period where the signal EVCINT is at a low level, the internal power supply circuit 28 enters in an always-on state. For this reason, the internal power supply circuit 28 enters in the always-on state during a predetermined period from the supply of the power. This is to increase various voltages such as the voltage VCWP to a necessary voltage level in a short time.

When the chip enable signal CEB is at a low level, that is, when the mode is the normal operation mode, the timer control circuit 32 always outputs a high-level signal. Only when the level of the chip enable signal CEB becomes high, the mode changes to the standby mode, and the level of the signal EVCINT input from the start-up circuit 30 is a high level, the timer control circuit 32 outputs a signal TIMEB (illustrated in the second graph of FIG. 3) whose level is switched to a low level to the periodic signal generating circuit 34.

When the level of the signal EVCINT is a low level, the level of the signal TIMEB becomes high and the periodic signal generating circuit 34 does not operate.

Figure 3:
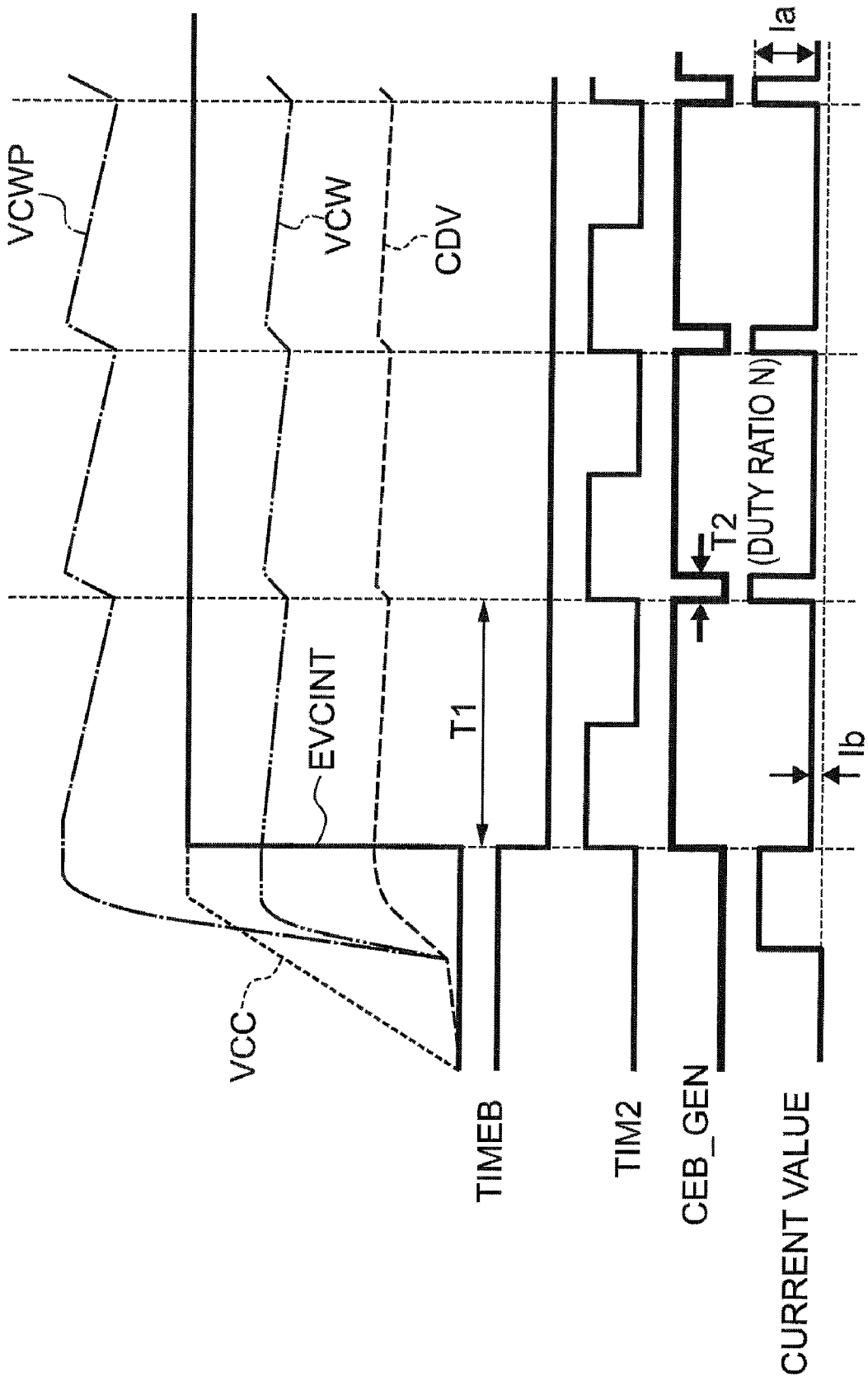
FIG. 3 illustrates waveforms of signals from individual components of the internal power supply control circuit and an internal power supply circuit.

When the level of the signal TIMEB input from the timer control circuit 32 becomes low, the periodic signal generating circuit 34 outputs a periodic signal TIM2, which repeats a high level and a low level with a predetermined period T1 as illustrated in the third graph of FIG. 3, to the internal power supply enable signal generating circuit 36.

The internal power supply enable signal generating circuit 36 outputs to the internal power supply circuit 28 the internal power supply enable signal CEB_GEN whose level becomes low during a predetermined period T2 with a predetermined duty ratio N in synchronization with a rising edge of the periodic signal TIM2 input from the periodic signal generating circuit 34.

When the chip enable signal CEB is at a low level, the internal power supply enable signal generating circuit 36 always maintains the level of the internal power supply enable signal CEB_GEN at a low level.

Figure 4:
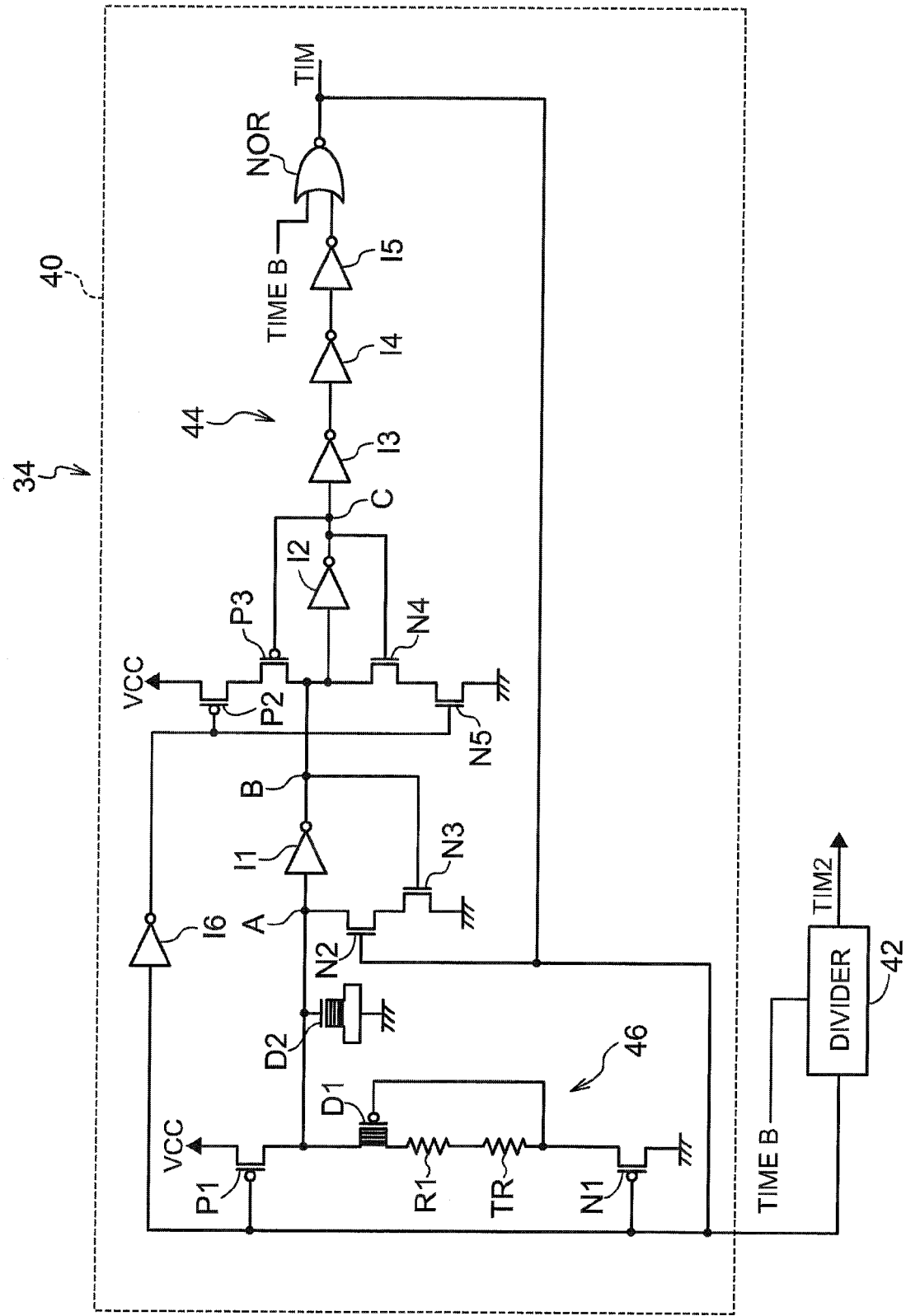
FIG. 4 is a circuit diagram of a periodic signal generating circuit.

FIG. 4 illustrates the circuit configuration of the periodic signal generating circuit 34. As illustrated in FIG. 4, the periodic signal generating circuit 34 includes a source oscillation circuit 40 and a divider 42. The source oscillation circuit 40 outputs a source oscillation signal TIM having a predetermined period to the divider 42.

When a level of the signal TIMEB output from the timer control circuit 32 becomes low, the divider 42 outputs the periodic signal TIM2 that is obtained by dividing the source oscillation signal TIM output from the source oscillation circuit 40 by n.

The source oscillation circuit 40 includes a ring oscillator 44 that is configured to include inverters I1 to I5 of an odd number (five in the exemplary embodiment), and a delay circuit 46.

In the delay circuit 46, a DMOS transistor D2 functioning as a capacitor is connected in parallel to a circuit where a DMOS transistor D1, a resistor R1, and a trimming resistor TR are connected in series.

The delay circuit 46 may adjust a resistance value by the trimming resistor TR and adjust a period of the source oscillation signal TIM output from the source oscillation circuit 40.

The DMOS transistor D1 of the delay circuit 46 is connected to the PMOS transistor P1 and the trimming resistor TR is connected to the NMOS transistor N1. A connection point of the DMOS transistor D1 and the PMOS transistor P1 is a gate of the DMOS transistor D2 functioning as the capacitor where a drain and a source are connected, a drain of the NMOS transistor N2 of the NMOS transistors N2 and N3 that are connected in series, and the input side of the inverter I1 of an initial stage.

The output side of the inverter I1 is connected to the input side of the inverter I2 of a next stage and a gate of the NMOS transistor N3. The input side of the inverter I2 is connected to the PMOS transistors P2 and P3 that are connected in series and to the NMOS transistors N4 and N5 that are connected in series.

Gates of the PMOS transistor P2 and the NMOS transistor N5 are connected to the output side of an inverter I6 where the input side is connected to gates of the PMOS transistor P1 and the NMOS transistor N1.

The output side of the inverter I2 is connected to the input side of the inverter I3 of a next stage and gates of the PMOS transistor P3 and the NMOS transistor N4. The output side of the inverter I3 is connected in series to the inverters I4 and I5 and the output side of the inverter I5 of a final stage is connected to one input side of a NOR circuit NOR. The other input side of the NOR circuit NOR receives the signal TIMEB that is output from the timer control circuit 32. Accordingly, the NOR circuit NOR performs a NOR operation on the signal TIMEB and an output signal from the inverter I5 of the final stage and outputs a NOR operation result as the source oscillation signal TIM.

The output side of the NOR circuit NOR is connected to the gates of the PMOS transistor P1, the NMOS transistor N1, and the NMOS transistor N2 and the input side of the divider 42.

Figure 5:
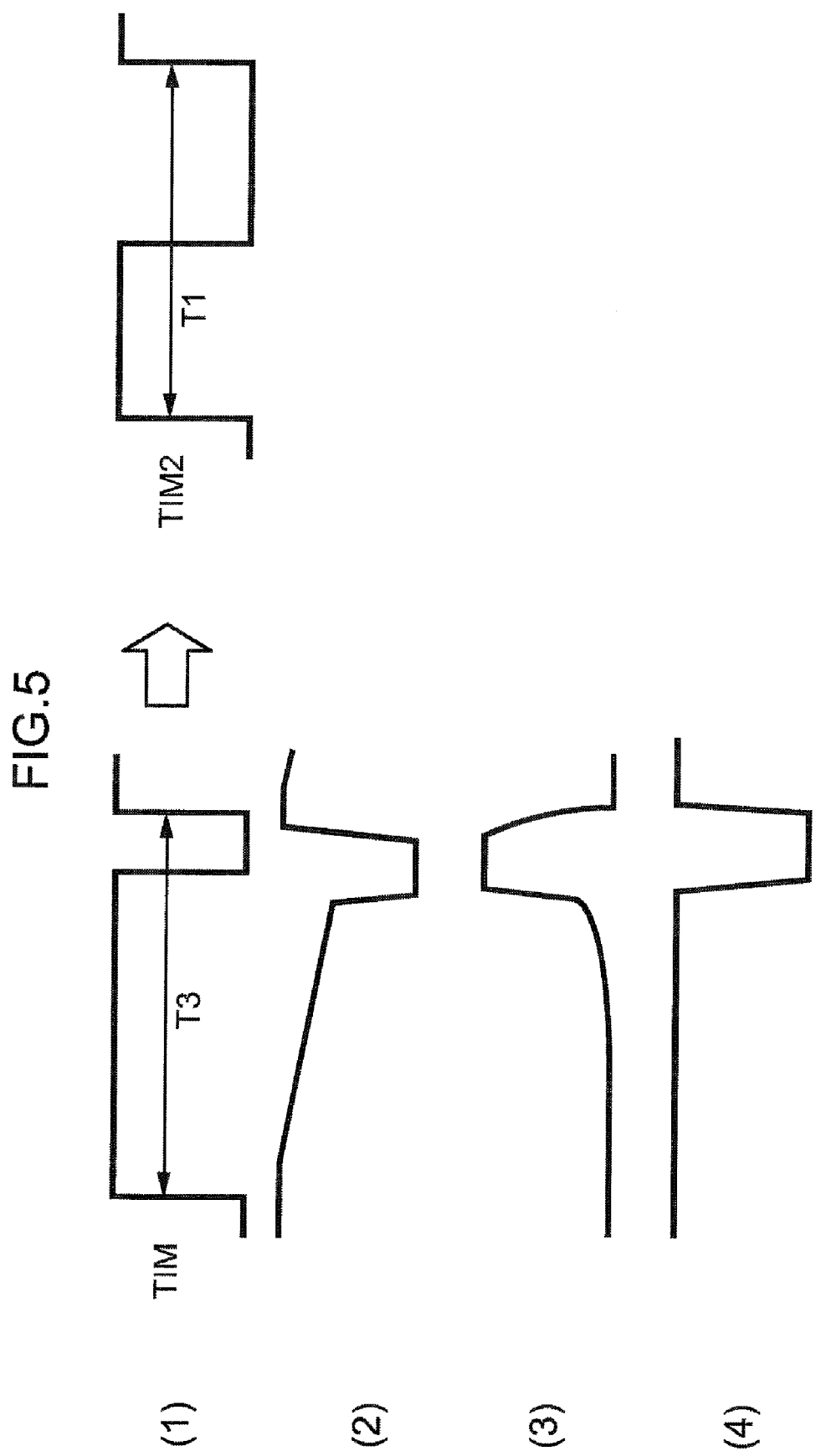
FIG. 5 illustrates waveforms of signals from individual components of the periodic signal generating circuit.

When a level of the signal TIMEB output from the timer control circuit 32 becomes low, the source oscillation circuit 40 generates a source oscillation signal TIM having a source oscillation period T3 illustrated in FIG. 5(1) and outputs the source oscillation signal TIM to the divider 42.

The divider 42 outputs a periodic signal TIM2 having a period T1 (illustrated in FIG. 5(1)), which is obtained by dividing the period of the input source oscillation signal TIM by n (for example, 64), to the internal power supply enable signal generating circuit 36.

FIG. 5(2) illustrates a waveform of a voltage of a point A that is input to the inverter I1 of the first stage, FIG. 5(3) illustrates a waveform of a voltage of a point B that is output from the inverter I1 of the first stage, and FIG. 5(4) illustrates a waveform of a voltage of a point C that is output from the inverter I2 of the second stage.

Figure 6:
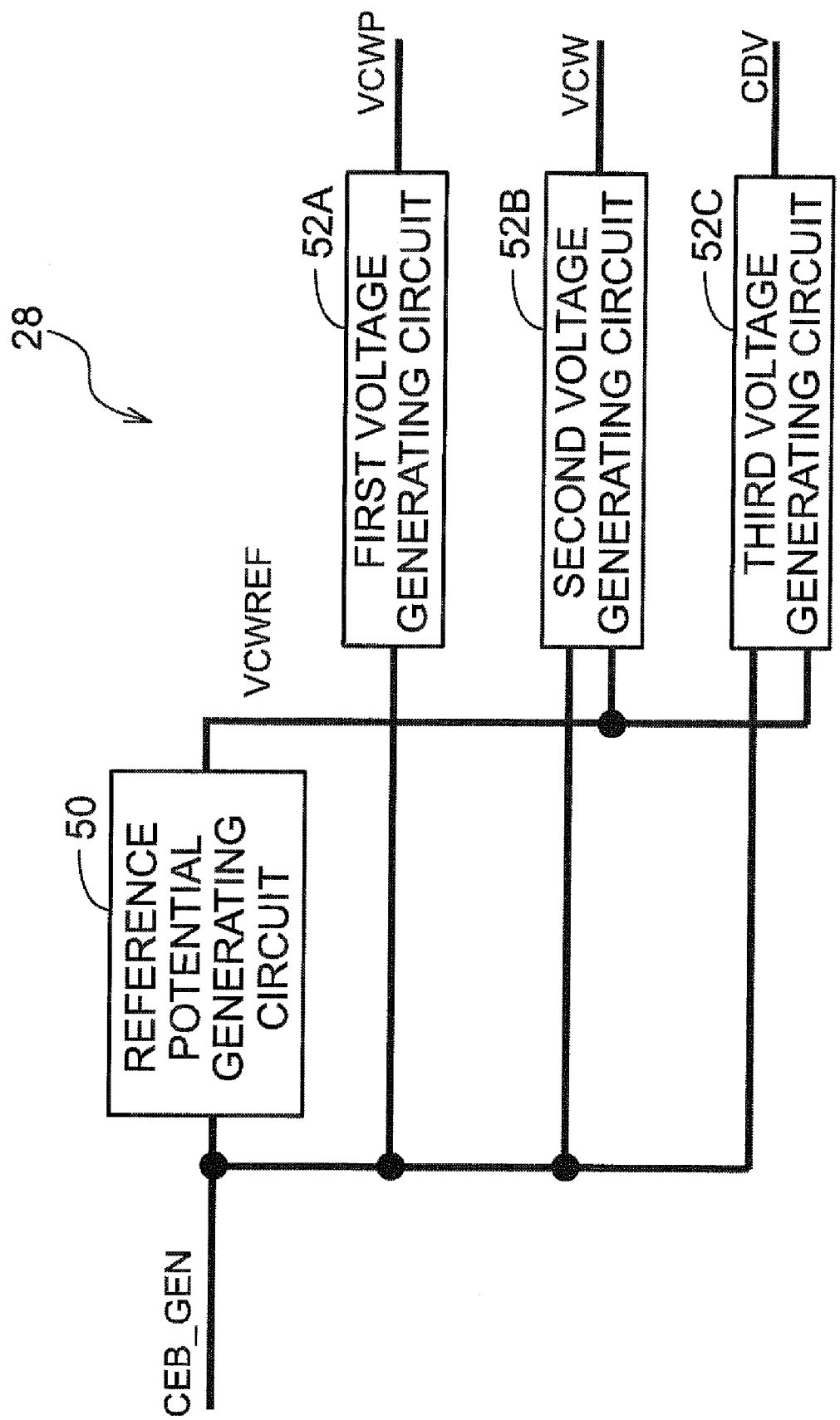
FIG. 6 is a diagram illustrating the schematic configuration of the internal power supply circuit.

As illustrated in FIG. 6, the internal power supply circuit 28 includes a reference potential generating circuit 50, a first voltage generating circuit 52A to generate a voltage VCWP, a second voltage generating circuit 52B to generate a voltage VCW, and a third voltage generating circuit 52C to generate a voltage CDV.

When the level of the internal power supply enable signal CEB_GEN output from the internal power supply enable signal generating circuit 36 becomes low, the reference potential generating circuit 50 generates a reference voltage VCWREF and outputs the reference voltage VCWREF to the first to third voltage generating circuits 52A to 52C.

The first voltage generating circuit 52A generates the voltage VCWP, based on the input reference voltage VCWREF, and outputs the voltage VCWP to the row decoder selector 16 and the column decoder 18.

The second voltage generating circuit 52B generates the voltage VCW, based on the input reference voltage VCWREF, and outputs the voltage VCW to the row decoder selector 16.

The third voltage generating circuit 52C generates the voltage CDV, based on the input reference voltage VCWREF, and outputs the voltage CDV to the sense amplifier 22.

When the level of the internal power supply enable signal CEB_GEN output from the internal power supply enable signal generating circuit 36 becomes low, the internal power supply circuit 28 supplies power to the individual components in the ROM 10. The bottom graph of FIG. 3 illustrates a waveform of a consumption current of the internal power supply circuit 28 in the standby mode.

As such, in the standby mode, the internal power supply enable signal CEB_GEN is a signal that intermittently permits the supply of power from the internal power supply circuit 28. When the internal power supply enable signal CEB_GEN is at a high level, the consumption current of the internal power supply circuit 28 becomes almost zero. Thereby, in the standby mode, since the ROM 10 intermittently operates, as illustrated in FIG. 3, the voltages VCWP, VCW, and CDV that are output from the internal power supply circuit 28 output the same set values as those in the case of the normal operation during the period T2 where the level of the internal power supply enable signal CEB_GEN becomes low, during the period where the signal TIMEB is at a low level, and gradually decrease during the other periods. This operation is repeated.

Therefore, even in the standby mode, the consumption current may be suppressed while a voltage level is maintained at an arbitrary level. As a result, the consumption current of the ROM 10 in the standby mode may be suppressed. When the mode changes to the normal operation mode, the level of the voltage that is applied to the individual components of the ROM 10 may be quickly increased to a necessary level, which results in suppressing an access speed from being lowered.

Next, a method that sets the period T1 of the periodic signal TIM2 output from the periodic signal generating circuit 34 will be described.

For example, the period T1 of the periodic signal TIM2 is set as follows.

$$T1 = (IVCL \times CV)/IL \qquad \text{[Equation 1]}$$

In this case, IVCL indicates a voltage that is supplied from the internal power supply circuit 28 in the standby mode, for example, a voltage decrease value V when the voltage VCW decreases, that is, a value indicating an allowable decrease amount in the voltage in the standby mode. The voltage IVCL is set to a value where the access standard of the ROM 10 may be satisfied. CV indicates a capacitance value F of all capacity components that includes a parasitic capacity in the internal power supply circuit 28, which is previously calculated based on a designed value of a circuit. IL indicates a maximum value A of a leak current from the internal power supply circuit 28 in the standby mode, which is previously calculated by a measurement.

For example, when the voltage IVCL is set to 0.1 V, that is, a value allowing a decrease in the voltage until 0.1 V in the standby mode, the capacitance value CV is set to $1 \times 10^{-9}$ F, and the maximum value IL is set to $1 \times 10^{-7}$ A, the period T1 becomes 1 ms by the above Equation 1. When a duty ratio N is set to $1/10000$, the period T2 where the level of the internal power supply enable signal CEB_GEN becomes low becomes about 100 ns.

In order to select a ROM where the maximum value IL may be more than the set value ($1 \times 10^{-7}$ A in the case of the above example) and the voltage decrease value may become more than the set value of the voltage IVCL in the period T1 determined by the above Equation 1, a test mode where a generation source (row decoder or column decoder) of a leak current from various internal power supply levels in the standby mode is connected and the leak source (trimming circuit) from the internal power supply levels in the modes other than the standby mode is opened (not connected) may be prepared, the leak currents of the various internal power supply levels in the standby mode may be measured through the test mode, and it may be determined that a ROM where the measured leak current is more than the set value of the voltage IL is defective.

An active time when the internal power supply circuit 28 is intermittently operated, that is, the period T2 where the level of the internal power supply enable signal CEB_GEN becomes a low level is set to become a time until the level of each voltage output from the internal power supply circuit 28 indicates a predetermined stable value.

The inventors have confirmed that, from the period T1 of the periodic signal TIM2 and the period T2 where the level of the internal power supply enable signal CEB_GEN becomes a low level, when the duty ratio N becomes about $1/10000$ and the maximum current Ia (refer to the bottom graph of FIG. 3) at the time of operating the internal power supply circuit 28 is about 5 mA, the consumption current of the internal power supply circuit 28 may be suppressed to an average of 0.5 µA corresponding to 1/10000. In addition, the inventors have confirmed that the consumption current may be suppressed to a total of 1.5 µA, from 0.5 µA corresponding to the consumption current of the internal power supply circuit 28 and about 1 µA corresponding to the consumption current Ib (refer to the bottom graph of FIG. 3) of the periodic signal generating circuit 34.

When the internal power supply circuit 28 is always operated, a current of at least several tens or several hundreds of microamperes flows. However, if the configuration according to the exemplary embodiment is adopted, the consumption current may be suppressed to 1 to 2 µA while the level of the voltage output from the internal power supply circuit 28 in the standby mode is maintained. Even when the current standard in the standby mode is about 10 µA, the current standard may be satisfied.

Figure 7:
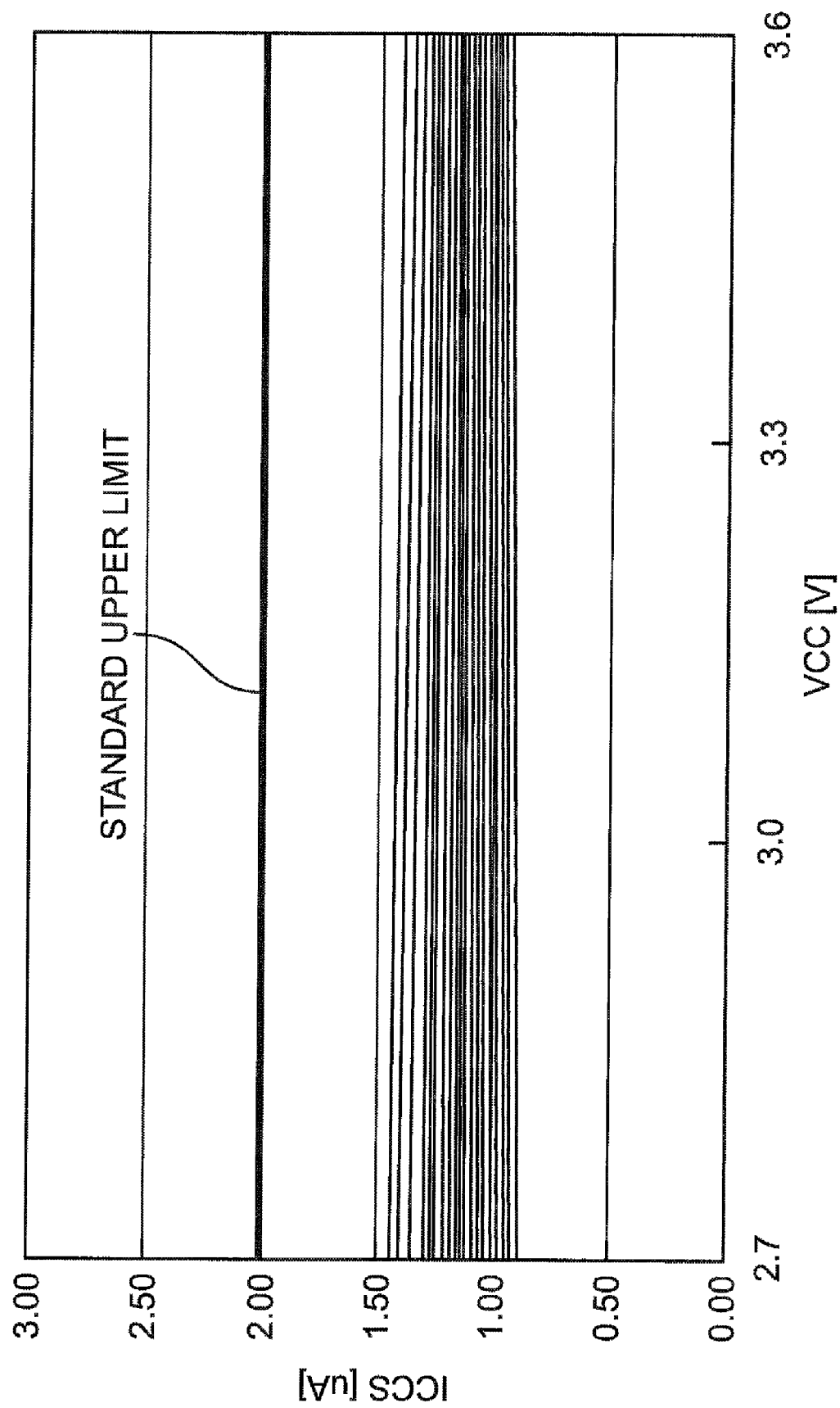
FIG. 7 is a diagram illustrating a relationship between a power supply voltage and a consumption current in a standby mode.

FIG. 7 illustrates a measurement result of the total consumption current (ICCS) of the internal power supply circuit 28 according to the exemplary embodiment in the standby mode, under various temperatures and power supply voltages. As illustrated in FIG. 7, even when the current standard in the standby mode is 2 µA or less, the consumption currents in the standby mode under all the conditions become 1.5 µA or less.

Figure 8:
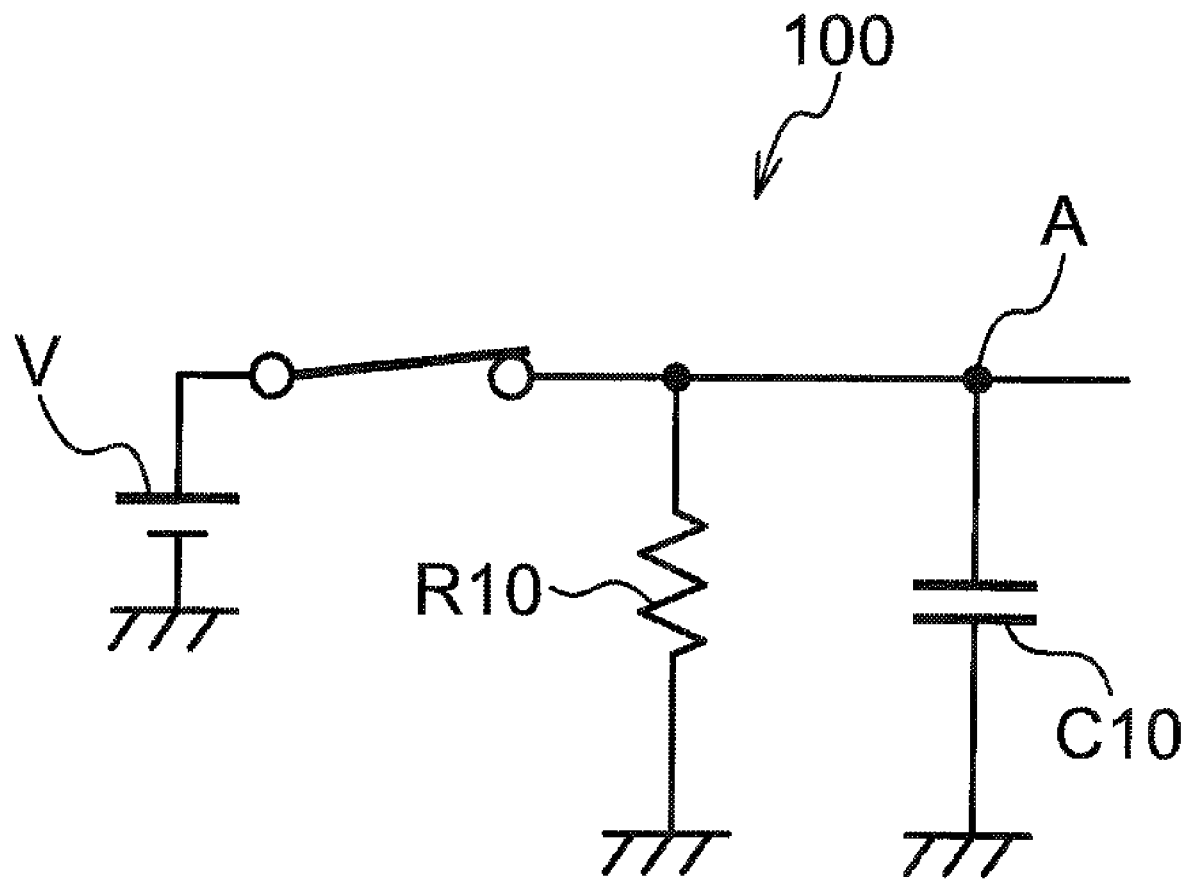
FIG. 8 is a circuit diagram of an RC-type delay circuit according to the related art.

Next, the delay time of the delay circuit will be described. First, an RC-type delay circuit 100 according to the related art illustrated in FIG. 8 where a resistor R10 and a capacitor C10 are connected in parallel will be described.

In the delay circuit 100, the potential V(t) of a node A is represented by the following Equation.

$$V(t)=V\times EXP(-t/\tau) \quad \text{[Equation 2]}$$

In this case, if a resistance value of the resistor R10 is defined as R and a capacitance value of the capacitor C10 is defined as C, $\tau=RC$ is realized. V indicates a power supply voltage.

For example, in the case of V=3.3 V, R=1 MΩ, and C=10 pF ($\tau$=0.00001), the time that is needed until the voltage of the node A becomes 1.65 V becomes $6.9315\times 10^{-6}$ s, from Equation 2.

Figure 9:
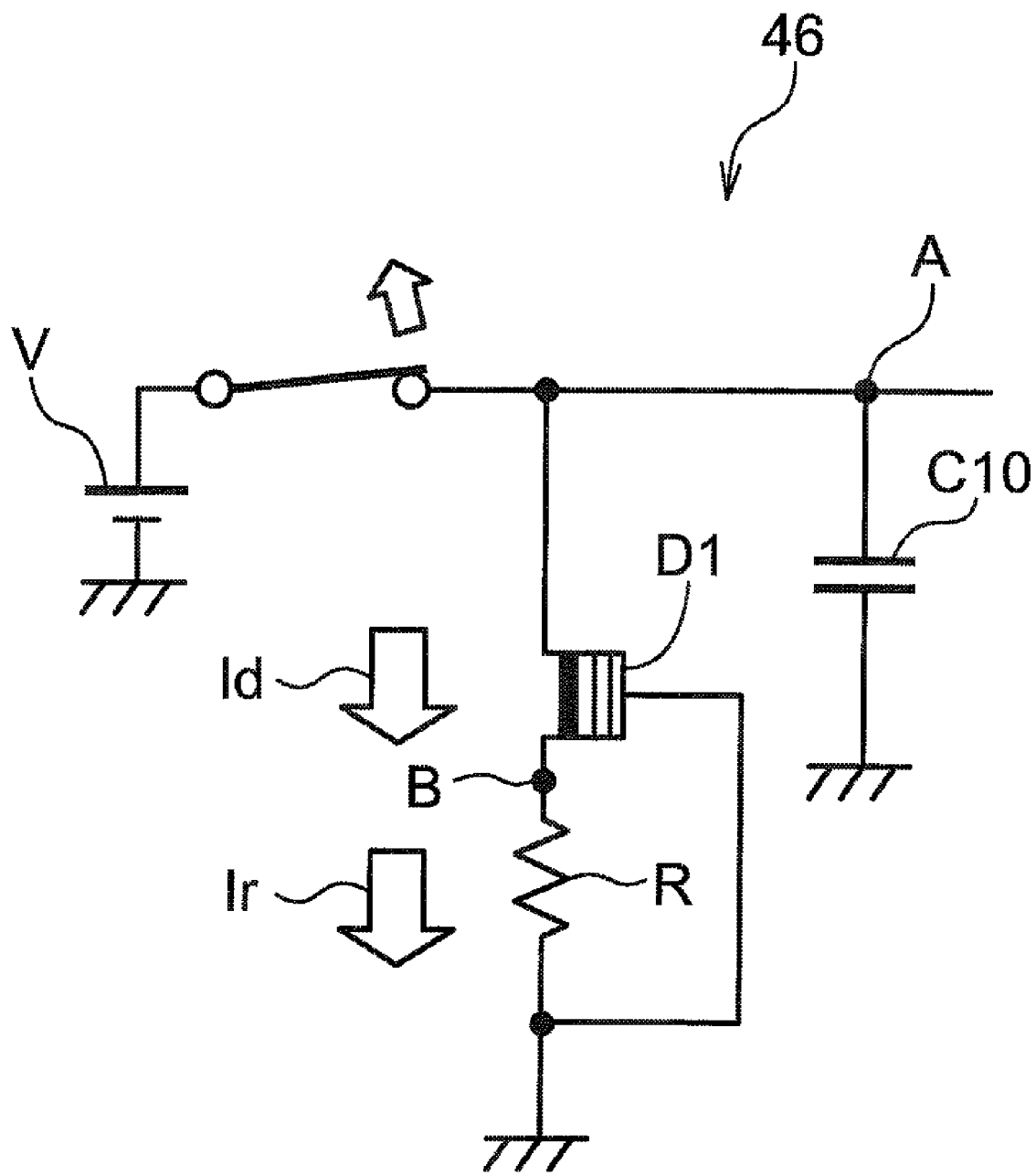
FIG. 9 is a circuit diagram of a delay circuit according to an exemplary embodiment.

Next, a delay time of the delay circuit 46 according to the exemplary embodiment will be described with reference to FIG. 9. The capacitor C10 illustrated in FIG. 9 corresponds to the DMOS transistor D2 of FIG. 4.

In the delay circuit 46, if the potential of the node B increases, the current Ir that flows through the resistor R10 increases, but the current Id that flows through the DMOS transistor D1 decreases. Since the DMOS transistor D1 and the resistor R1 are connected in series, the current of the place where both currents become equal to each other becomes a discharge current of the node A. Almost constant current flows without depending on the voltage level of the node A. However, the discharge current of the node A increases and decreases according to the I-V characteristic of the DMOS transistor D1.

In the case of the same conditions (R=1 MΩ, C=10 pF, and V=3.3 V) as those of the RC-type delay circuit, when the voltage of the node B is 1 V, the discharge current Ia of the node A becomes 1 V/1 MΩ=1 µA. At this time, the voltage V(t) of the node A is represented as follows.

$$V(t)=3.3-1\times 10^{5}\times t \quad \text{[Equation 3]}$$

In this case, the discharge time that is needed until the voltage of the node A becomes 1.65 V becomes $16.5\times 10^{-6}$ s, from Equation 3, and the delay time may become the delay time that is about 2.4 times longer than the delay time of the RC-type delay circuit.

In the case of the same conditions (R=1 MΩ, C=10 pF, and V=3.3 V) as those of the RC-type delay circuit, when the potential Vt of the DMOS transistor D1 is lower than that of the above case by about 1 V and the voltage of the node B becomes 2V, the discharge current Ia of the node A doubles and becomes 2 V/1 MΩ=2 µA.

At this time, the voltage V(t) of the node A is represented as follows.

$$V(t)=3.3-2\times 10^{5}\times t \quad \text{[Equation 4]}$$

In this case, the discharge time that is needed until the voltage of the node A becomes 1.65 V is $8.25\times 10^{-6}$ s, and is almost equal to the discharge time of the RC-type delay circuit. At this time, the delay time may not be extended.

Figure 10:
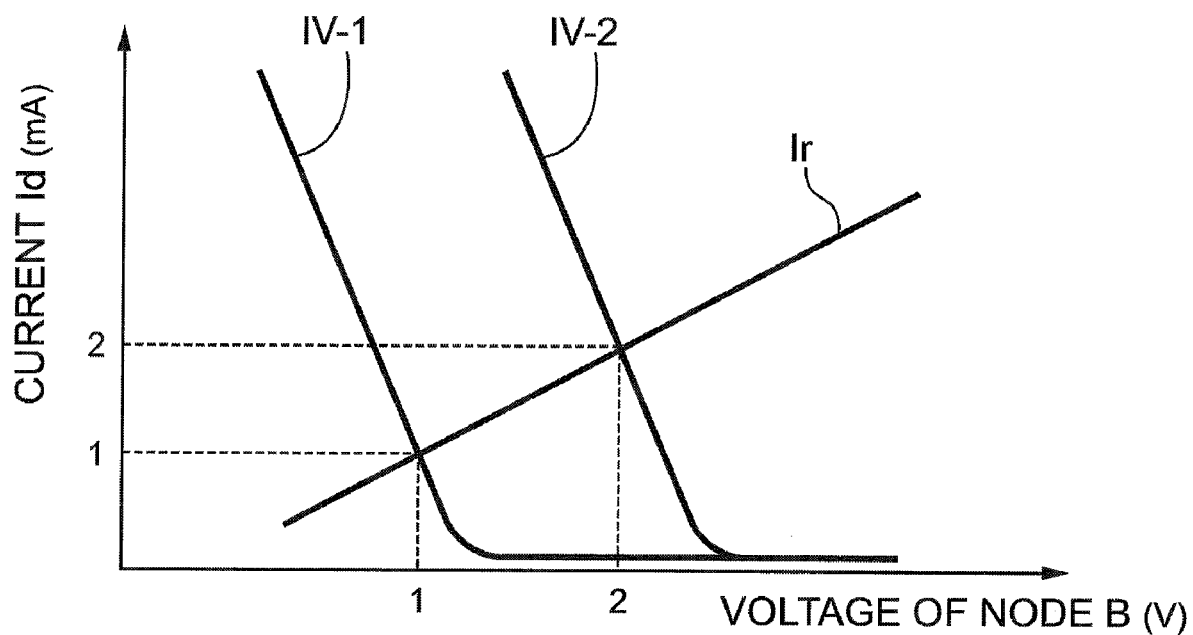
FIG. 10 is a diagram illustrating an I-V characteristic of a DMOS transistor.

FIG. 10 illustrates IV-characteristics IV-1 and IV-2 indicating relationships between voltages and currents Id of the node B of the two DMOS transistors D1 having different characteristics, and a characteristic of a current Ir flowing through the resistor R.

Figure 11:
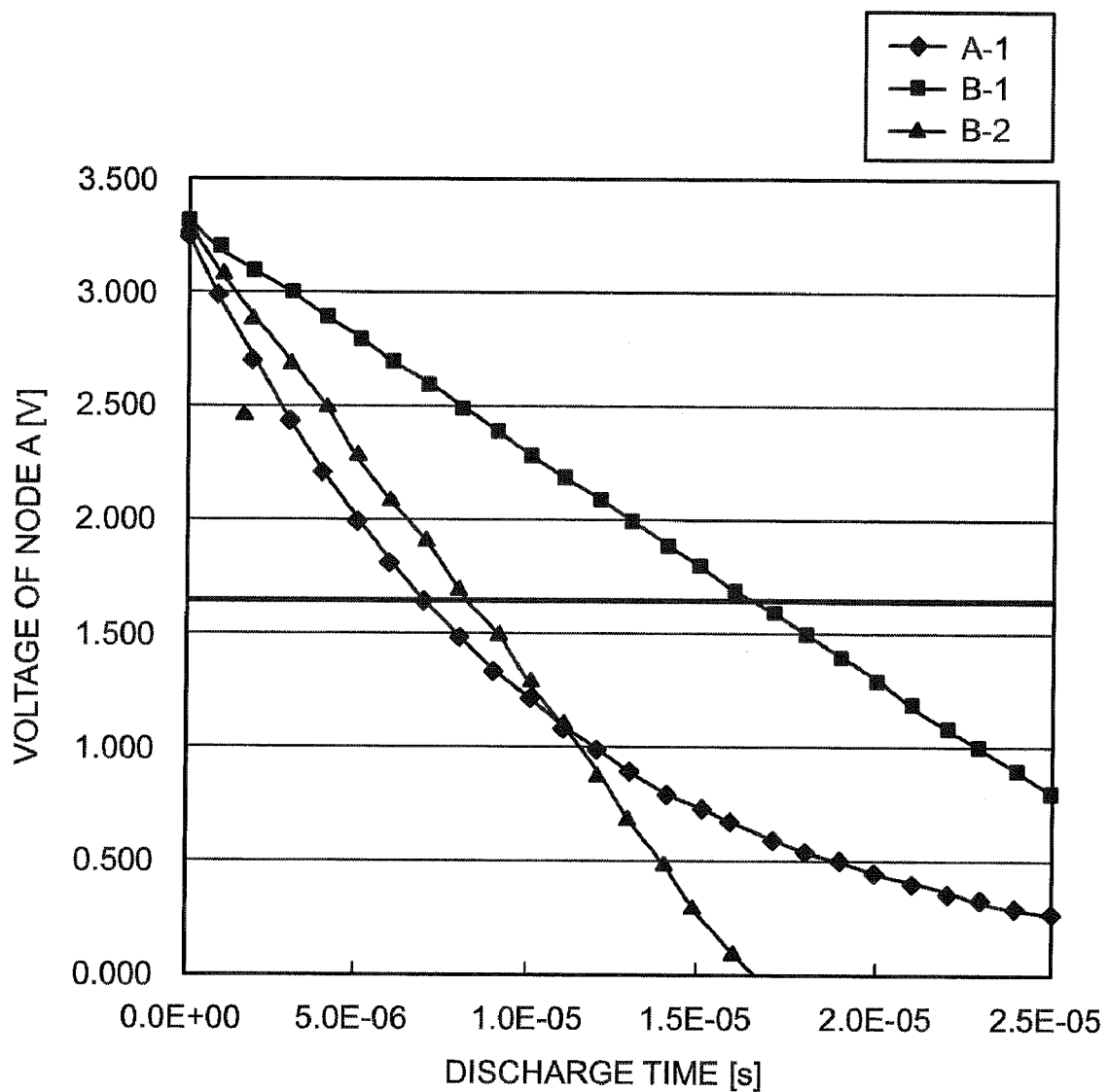
FIG. 11 is a diagram illustrating a relationship between a discharge time and a voltage of a node A of the delay circuit.

FIG. 11 illustrates a characteristic A-1 indicating a relationship between a discharge time and a voltage of the node A of the RC-type delay circuit, a characteristic B-1 indicating a relationship between a discharge time and a voltage of the node A when a voltage of the node B of the delay circuit 46 according to the exemplary embodiment is 1 V, and a characteristic B-2 indicating a relationship between a discharge time and a voltage of the node A when the voltage of the node B of the delay circuit 46 is 2 V. As illustrated in FIGS. 10 and 11, in the case of the delay circuit 46, a difference is generated in the discharge time of the node A according to the I-V characteristic of the DMOS transistor D1. For this reason, if the DMOS transistor D1 having the appropriate I-V characteristic is used, the delay time may be effectively increased, as compared with the RC-type delay circuit according to the related art. Thereby, the size of the resistor may be decreased.

Figure 12:
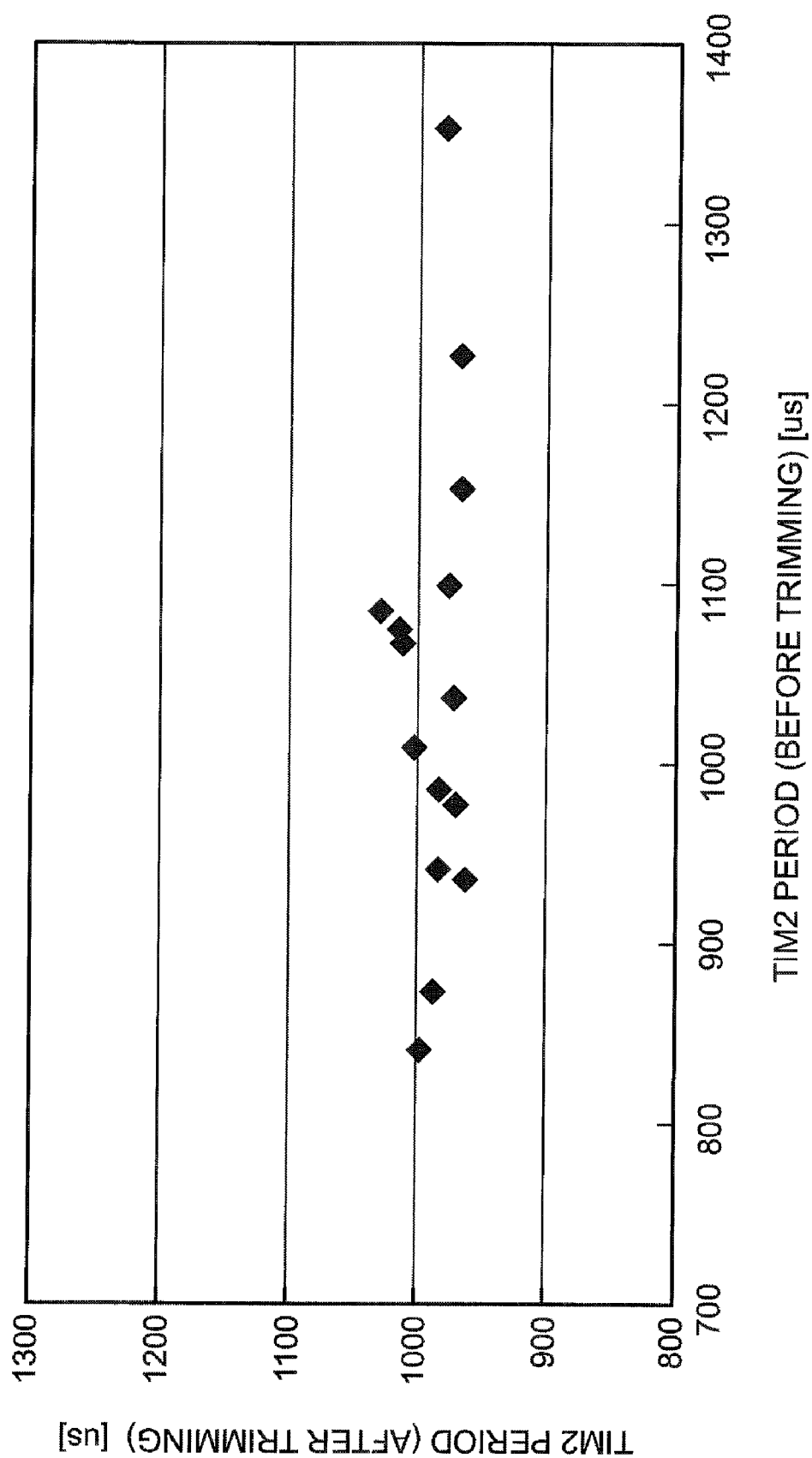
FIG. 12 is a diagram illustrating a relationship between a period of a periodic signal TIM2 before adjusting a resistance value by a trimming resistor and a period of the periodic signal TIM2 after adjusting the resistance value by the trimming resistor.

FIG. 12 illustrates a measurement result of a relationship between a period of a periodic signal TIM2 before trimming (adjusting) a resistance value by the trimming resistor TR, that is, when the trimming is not performed, and a period of the periodic signal TIM2 after trimming the resistance value, under conditions of the voltage VCC=2.7 V and the temperature T=25° C. As illustrated in FIG. 12, when the resistance value is not trimmed by the trimming resistor TR, the period changes from 850 to 1350 µs. When the resistance value is adjusted by the trimming resistor TR, the period may be adjusted to about 1000 µs.

Figure 13:
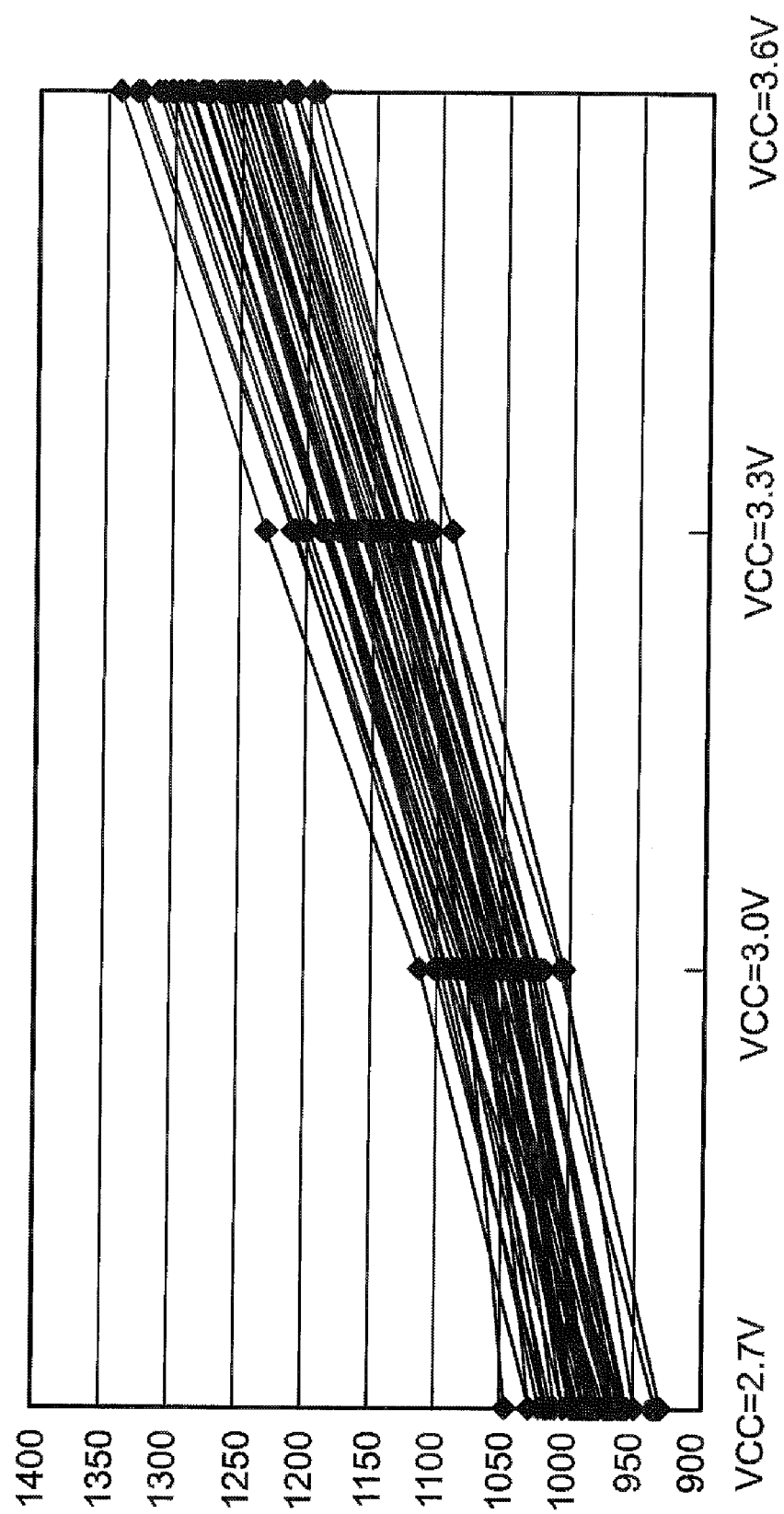
FIG. 13 is a diagram illustrating a relationship between a power supply voltage after adjusting the resistance value by the trimming resistor and the period of the periodic signal TIM2.
Figure 14:
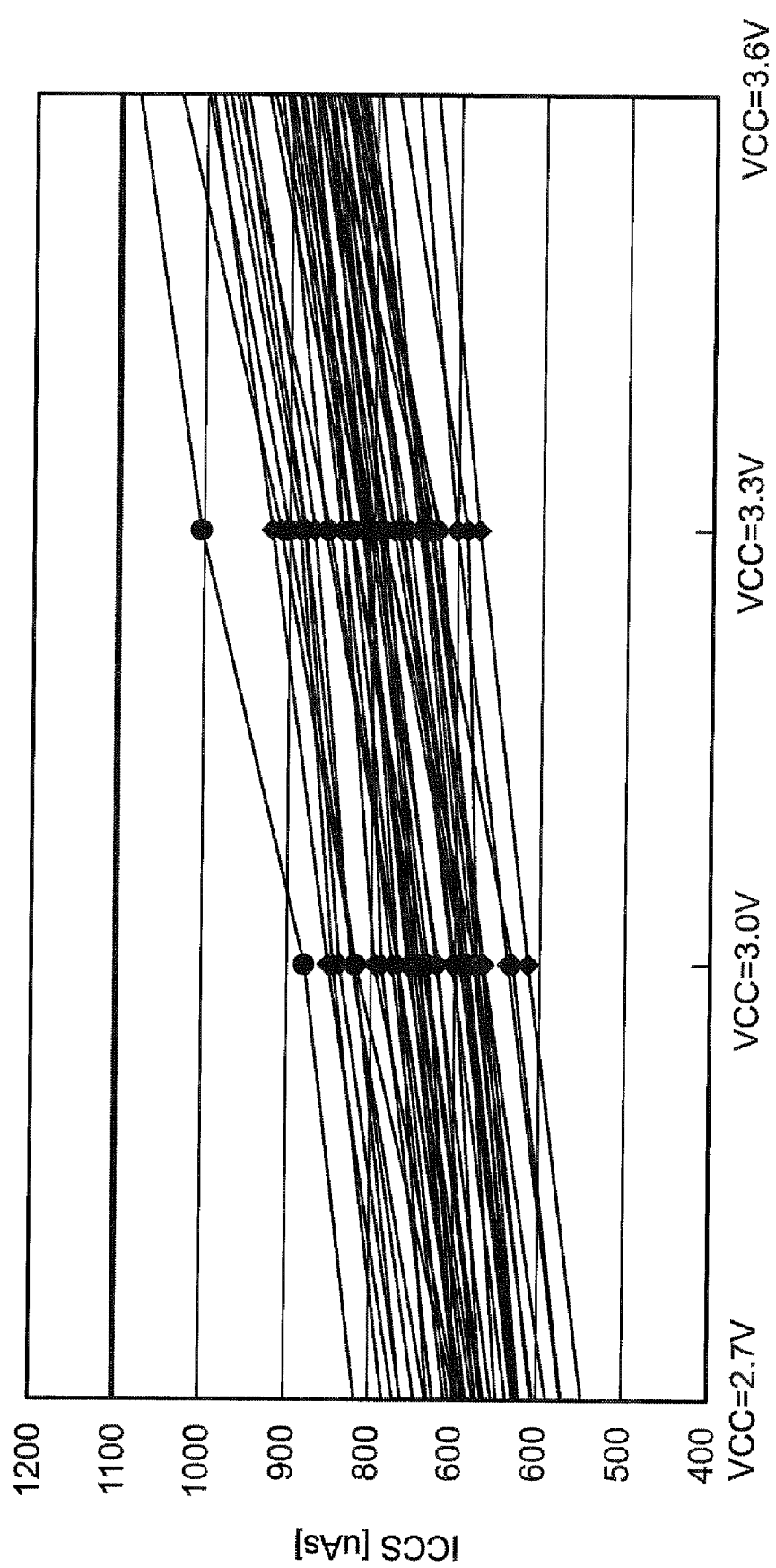
FIG. 14 is a diagram illustrating a relationship between the power supply voltage after adjusting the resistance value by the trimming resistor and a consumption current of a periodic signal generating circuit in the standby mode.

FIG. 13 illustrates a measurement result of a relationship between the voltage VCC and the period of the periodic signal TIM2 when the resistance value is adjusted by the trimming resistor TR, which is measured while parameters of the MOS transistor used in the periodic signal generating circuit 34 are variously changed. FIG. 14 illustrates a measurement result of a relationship between the voltage VCC and the consumption current (ICCS) of the periodic signal generating circuit 34 in the standby mode when the resistance value is adjusted by the trimming resistor TR, which is measured while parameters of the MOS transistor used in the periodic signal generating circuit 34 are variously changed. As illustrated in FIG. 13, when the resistance value is adjusted by the trimming resistor TR, the change in the period of the periodic signal TIM2 may be suppressed, regardless of the parameters of the MOS transistor. As illustrated in FIG. 14, when the resistance value is adjusted by the trimming resistor TR, the consumption current ICCS may be suppressed to the current less than 1.1 µA, regardless of the parameters of the MOS transistor.

In the exemplary embodiment, the case where the invention is applied to the ROM functioning as the semiconductor memory has been described, but the invention is not limited thereto. For example, the invention may be applied to any semiconductor memory, such as a DRAM, which has an internal power supply.

The internal power supply control circuit of the semiconductor memory according to the exemplary embodiment may provide the periodic signal generating unit including a ring oscillator that has an oscillator composed of inversion logic elements of an odd number connected in series and a delay circuit delaying an input signal input to the oscillator, and the delay circuit including a circuit in which a MOS transistor where one of a drain and a source is connected to the input side of the oscillator and a variable resistor element adjusting a resistance value where one end is connected to the other of the drain and the source of the MOS transistor and the other end is connected to a gate of the MOS transistor are connected in series.

According to the exemplary embodiment, the consumption current in the standby mode may be suppressed, and the access speed may be suppressed from being lowered, when the mode changes to the normal operation mode.

What is claimed is:

1. An internal power supply control circuit of a semiconductor memory, comprising:
    a periodic signal generating unit that generates a periodic signal to generate an intermittent permission signal to intermittently permit supply of power from an internal power supply circuit of the semiconductor memory to an internal circuit thereof with a predetermined period, when a mode changes from a normal operation mode during which power is always supplied from the internal power supply circuit to the internal circuit to a standby mode during which the power consumption is less than that in the normal operation mode; and
    an intermittent permission signal output unit that receives, as inputs, a mode signal indicating either the normal operation mode or the standby mode and the periodic signal, and outputs the intermittent permission signal synchronized with the periodic signal to the internal power supply circuit when the input mode signal indicates the standby mode.

2. The internal power supply control circuit of claim 1, wherein the periodic signal generating unit comprises a ring oscillator that has an oscillator composed of an odd number of inversion logic elements connected in series and a delay circuit delaying an input signal input to the oscillator, and
    the delay circuit comprises a circuit in which a MOS transistor and a variable resistor element with an adjustable resistance value are connected in series, one of a drain or a source of the MOS transistor being connected to the input side of the oscillator, the other of the drain or the source of the MOS transistor being connected to the one end of the variable resistor element, and the other end of the variable resistor element being connected to a gate of the MOS transistor.

* * * * *